United States Patent [19]

Szluk

[11] Patent Number: 4,701,423

[45] Date of Patent: Oct. 20, 1987

[54] TOTALLY SELF-ALIGNED CMOS PROCESS

[75] Inventor: Nicholas J. Szluk, Fort Collins, Colo.

[73] Assignee: NCR Corporation, Dayton, Ohio

[21] Appl. No.: 811,187

[22] Filed: Dec. 20, 1985

[51] Int. Cl.$^4$ ............................................ H01L 21/265
[52] U.S. Cl. ........................................ 437/57; 437/44
[58] Field of Search ................ 148/1.5; 29/571, 576 B

[56] References Cited

U.S. PATENT DOCUMENTS

| | | | |
|---|---|---|---|
| 4,084,311 | 4/1978 | Yasuoka et al. | 29/571 |
| 4,198,250 | 4/1980 | Jecmen | 148/1.5 |
| 4,330,931 | 5/1982 | Liu | 29/571 |
| 4,345,366 | 8/1982 | Brower | 29/571 |
| 4,356,623 | 11/1982 | Hunter | 29/571 |
| 4,366,613 | 1/1983 | Ogura et al. | 29/571 |
| 4,382,827 | 5/1983 | Romano-Moran et al. | 148/1.5 |
| 4,391,650 | 7/1983 | Pfeifer et al. | 148/1.5 |
| 4,419,810 | 12/1983 | Riseman | 29/576 B |
| 4,422,885 | 12/1983 | Brower et al. | 148/1.5 |
| 4,441,247 | 4/1984 | Gargini et al. | 148/1.5 |
| 4,480,375 | 11/1984 | Cottrell et al. | 29/571 |
| 4,503,601 | 3/1985 | Chiao | 29/571 |
| 4,530,150 | 7/1985 | Shirato | 29/576 B |
| 4,536,944 | 8/1985 | Bracco et al. | 29/576 B |
| 4,584,027 | 4/1986 | Metz, Jr. et al. | 148/1.5 |
| 4,590,663 | 5/1986 | Haken | 29/571 |
| 4,648,175 | 3/1987 | Metz et al. | 29/589 |

OTHER PUBLICATIONS

Tsang et al., "Fabrication of High-Performance LDDFET's With Oxide Sidewall-Spacer Technology," IEEE Transactions on Electron Devices, vol. ED-29, No. 4, Apr. 1982, pp. 590-596.

Ogura et al., "Design And Characteristics of the Lightly Doped Drain-Source (LDD) Insulated Gate Field Effect Transistor", IEEE Transactions on Electron Devices, vol ED-27, No. 8, Aug. 1980, pp. 1359-1367.

Ogura and Rovedo, "Latch-Up Free, Double Gated, Enhancement-Type P-Channel Device for CMOS With Enhanced Transconductance," IBM Technical Disclosure Bulletin, vol. 27, No. 1B, Jun. 1984, pp. 722-727.

Muramoto et al., "A New Self-Aligning Contact Process for MOS LSI," IEDM Technical Digest, 1978, pp. 185-188.

Mikkelson et al., "An NMOS VLSI Process for Fabrication of a 32-Bit CPU Chip", IEEE Journal of Solid-State Circuits, vol. SC-16, No. 5, Oct. 1981, pp. 542-547.

Primary Examiner—Brian E. Hearn
Assistant Examiner—Mary Wilczewski
Attorney, Agent, or Firm—Wilbert Hawk, Jr.; Casimer K. Salys

[57] ABSTRACT

A CMOS process incorporates self-aligned buried contacts, lightly doped source/drain structures, and sidewall oxide spacers. The process is tailored so that individual process steps and structural features serve several functions, thereby providing the desirable structural features and small geometry in conjunction with fast operational speeds, reduced Miller capacitance and short channel effects in a process of minimum complexity.

5 Claims, 19 Drawing Figures

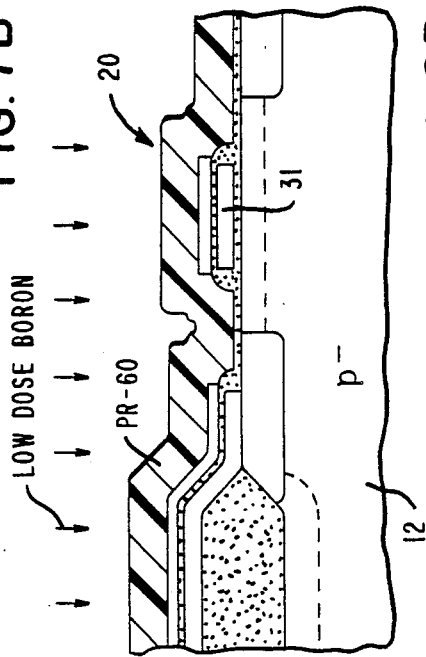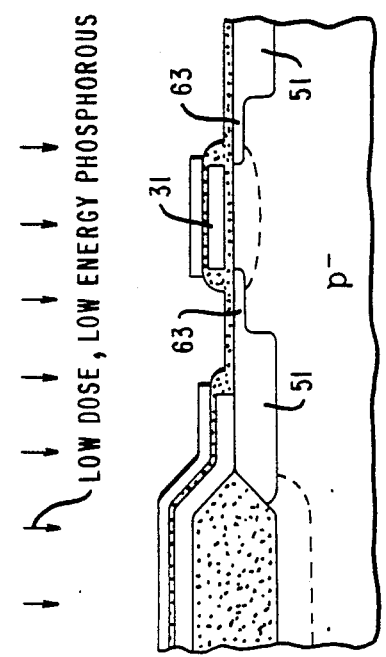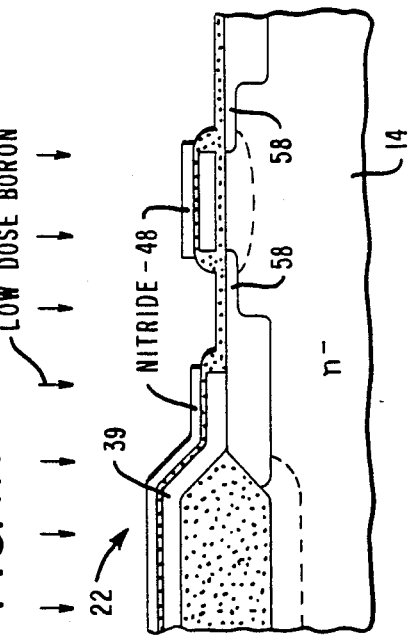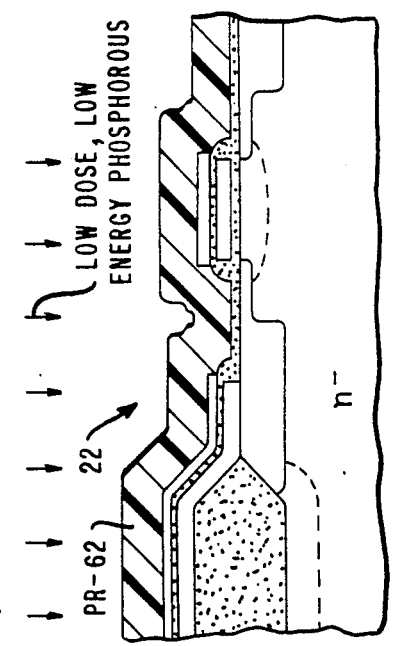

TOTALLY SELF-ALIGNED CMOS PROCESS

BACKGROUND OF THE INVENTION

The present invention relates to a method for forming totally self-aligned, small geometry CMOS integrated circuits having LDD (lightly doped source/drain) and self-aligned buried contacts. More particularly, the process sequence is defined so that the buried contacts are automatically aligned with the n+ and p+ source/drain regions, which are formed using a single lithographic mask, and n-type and p-type gates are provided for the respective n-channel and p-channel devices. Furthermore, the process sequence is designed so that a number of the steps serve dual or multiple purposes to provide the necessary structural features with minimum process complexity. The resulting CMOS integrated circuit is characterized by reduced minimum feature size, due in part to the self-aligned buried contacts, reduced Miller capacitance, and reduced short channel effects.

Historically, as the microelectronics industry has attempted to develop small geometry, highly dense MOS integrated circuit components, various structural and operational problems have combined to limit device performance and manufacturing yields and, thus, the achievable feature sizes and densities. Among the most difficult of the problems are those collectively called short channel effects, which include hot carrier injection into the gate oxide and/or substrate, source-drain punch through, reduced breakdown voltage and impact ionization. In hot carrier injection, for example, electrons are injected into the gate oxide by the high electric field created by the narrow channel region adjacent the drain and, as a consequence, alter the threshold voltage of the device. In addition to the short channel effects, overlap between the gate electrode and the source and drain results in parasitic capacitance between the diffusion region and the gate, known as Miller capacitance, which decreases high frequency response and operational speeds.

Small geometry MOS devices also incur electrical shorts between interconnecting conductors such as the electrical conductors which contact the gate, source and drain. In a widely used self-aligned contact approach, a refractory metal such as tungsten is selectively deposited over the polysilicon gate and the source-drain regions to form low resistance, self-aligned contacts between the interconnect lines and the source/drain/gate. However, because of the small VLSI feature sizes and the associated close spacing of the gate electrodes to the source/drain contact regions, the metal deposited in this manner can short the gate to the adjacent source/drain regions. Shorting can also occur between other conductors such as the polysilicon interconnect lines.

Thus, as channel lengths and other device dimensions are reduced in VLSI integrated circuits, new device structures such as LDD and gate electrode sidewall dielectric spacers have been developed to reduce short channel effects and to optimize transistor characteristics such as high transconductance, high breakdown voltage, fast operating speeds and device densities.

The LDD structure is a shallow, self-aligned n− or p− region formed between the MOSFET channel and the n+ or p+ source and drain diffusions. This structure increases breakdown voltage and reduces impact ionization and hot electron emission by spreading the high electric field at the drain pinchoff region into the n− or p− region.

The sidewall spacer is a layer of oxide which is selectively formed on the vertical edge of the gate electrode. This structure insulates the gate from the source/drain contact metallization and can be used as a dopant mask in a properly sequenced fabrication process to form the LDD structures in automatic alignment with the n+ and p+ source/drain diffusion regions.

Various approaches are summarized below for implementing LDD structures, gate electrode sidewall dielectric spacers, and low resistance gates and conductors and self-aligned contacts. The various documents discussed below are categorized based upon the perceived primary relevance of their disclosure.

Sidewall Dielectric and Self-Aligned LDD Structures

Sidewall dielectric spacers can be formed by various techniques, perhaps the simplest and most desirable being selective sidewall oxidation. The sidewall dielectric spacer has been used as an LDD dopant mask during n+ or p+ source/drain formation and/or to provide self-alignment for buried n+ and p+ contacts, in addition to the function of electrically isolating the gate from the contact metallization. For example, P. J. Tsang, et al., "Fabrication of High Performance LDDFET's with Oxide Sidewall-Spacer Technology", *IEEE Transactions on Electron Devices*, Vol. ED-29, No. 4, April 1982, pp 590–596, implants the entire source/drain to the n− LDD doping level using the gate definition mask as the implant mask, forms the gate electrode sidewall oxide spacers by chemical vapor deposition and vertical reactive ion etching (RIE), then uses the sidewall oxide as a doping mask to prevent implanting the LDD regions during the N+ source/drain implate.

U.S. Pat. No. 4,419,810, issued Dec. 13, 1983 to Riseman et al., used doped polysilicon and doped gate electrode sidewall oxide formed thereon as solid dopant sources for the n+ and LDD source/drain regions. Initially, a doped polycrystalline silicon (poly) layer is patterned over the n+ source/drain regions, and a doped sidewall dielectric of oxide, nitride etc. is formed thereon and etched from the horizontal surfaces. Then, the structure is heated to form the n+ and LDD source/drain regions by outdiffusion from the respective poly and oxide prior to forming the gate oxide and poly gate self-aligned with the existing sidewall dielectric.

Commonly assigned, U.S. Pat. No. 4,503,601 to Chiao, is directed to a reproducible manufacturing process for forming NMOS devices which incorporate both LDD structures and gate electrode sidewall oxide spacers and uses the sidewall oxide spacers as an LDD mask during the n+ source/drain implantation.

Initially, after patterning the gate electrode, n− LDD regions are formed in self-alignment with the gate by ion implantation. Then, a low temperature selective oxidation process is applied to form a much thicker layer of oxide on the vertical sidewalls of the highly doped polysilicon gate then over the lightly doped exposed substrate. The thin source/drain oxide is then readily removed, leaving thick sidewall oxide spacers which self-align the n+ source and drain implant with the LDD regions and also prevent shorting of the gate to the source/drain diffusion during subsequent metalization.

Another approach for forming LDD structures uses a gate overhang mask and single or double implant steps.

Jecmen, U.S. Pat. No. 4,198,250, issued Apr. 15, 1980, uses a silicon oxide overhang mask on the poly gate electrode to effect the implanting of an LDD structure. The overhang mask is provided by wet chemical overetching of the supporting poly gate, then the n+ source and the drain regions are implanted. During n+ implantation, the overhang mask partially blocks the ions so that the n+ source and drain implant also forms shallow, lightly doped n− LDD regions between the mask overhang self-aligned with the gate electrode and the n+ source and drain regions.

The Jecmen '250 patent discusses another known potential advantage of LDD regions, relating to decreased Miller gate overlap capacitance. That is, properly configured LDD regions do not diffuse as readily as highly doped regions during the subsequent high temperature process. As a consequence, the LDD regions do not significantly increase any overlap with the gate, and also retain their shallow junction depth during subsequent processing. The initial, shallow, aligned LDD regions and the subsequent dimensional stability provide reduced Miller capacitance.

Liu, U.S. Pat. No. 4,330,931, issued May 25, 1982, uses a silicon nitride gate overhang mask and, like Jecmen, uses a single implant step to form an LDD NMOSFET. Here, the overhang mask partially blocks ions during the n+ source/drain implant so that the n+ implant simultaneously forms n− LDD structures self-aligned with the n+ regions and the gate electrode. The structure is next subjected to high temperature oxidation step to grow oxide over the sides of the polysilicon gate and of the substrate corresponding to the source and drain regions. The oxide over the n+ source and drain regions is then damaged by argon ion implantation, using the nitride overhang mask to protect the sidewall oxide over the LDD regions. The damaged oxide and the nitride mask are then removed and a tungsten layer is selectively deposited over the n+ source and drain regions and the gate.

Gate/Conductor Doping

Both single conductivity doping (preferably n-type) and dual conductivity doping (n-type and p-type) are used in the CMOS technology to provide low resistance polycrystalline silicon conductors. The advantage of the dual conductivity approach is process simplicity, in that the poly conductors can be doped during the respective PMOS and NMOS source drain doping. This approach requires the use of a metal bridge or shunt between the n+ and p+ poly conductors.

Single conductivity doping eliminates the need for metal bridges or shunts, as well as eliminating the possibility of threshold voltage instability which results if boron diffusion from a boron doped p+ gate electrode of a PMOS devices into the associated channel.

Commonly assigned U.S. Pat. No. 4,391,650 issued July 5, 1983 to Pfeifer et al., provides single conductivity n-type gates and conductors by patterning and implant-masking the poly early in the integrated circuit fabrication process. That is, the poly gates are masked and PMOS and NMOS source/drains are doped, then the source/drains are masked and the poly is implanted.

A different, single conductivity poly-doping approach is disclosed in commonly assigned Brower et al. U.S. Pat. No. 4,422,885 issued Dec. 27, 1983. The Brower et al. patent first dopes the poly gate/conductor layer n-type, then masks and patterns the poly, and dopes the PMOS and NMOS/drains using the poly definition mask as an implant mask. Somewhat related techniques are set forth in commonly assigned U.S. Pat. No. 4,345,366 issued Aug. 24, 1982 to Brower, and U.S. Pat. No. 4,382,827 issued May 10, 1983 to Romano-Moran et al.

An intrinsic, undoped polysilicon conductivity approach is described in commonly assigned Metz et al. U.S. Pat. No. 4,648,175 filed June 12, 1985. The Metz et al. application provides a unitary conductor/buried contact structure by forming a composite metal shunt-over-poly conductor pattern which contacts diffused substrate source/drain contact regions, then anneals the structure to define low resistance contacts by updiffusion from the n+ and p+ regions and/or reduction of the polycrystalline silicon to tungsten silicide.

Self-Aligned Contacts

U.S. Pat. No. 4,084,311, issued Apr. 18, 1978 to Yasuoka et al., discloses a so-called self-aligned contact CMOS process in which an oxide masking layer and a dielectric isolation layer are etched simultaneously to form contact cuts. Initially, the NMOS and PMOS source/drain/gate (but not the gate oxide) are patterned and shallow p+ and n+ source/drain/gate are implanted. Then, composite oxide-nitride dielectric isolation layers are blanket formed and source/drain contact cuts are formed in the nitride. The NMOS and PMOS devices are alternatively masked and contact cuts are made therein, then deep n+ and p+ source/drain/contacts are formed at the contact cuts. These contact cuts are formed self-aligned by the process of forming the oxide masking layer over the PMOS and NMOS devices and alternately masking the oxide in one active area and etching the other so that the nitride acts as a contact mask, and the etchant for the oxide mask automatically completes the contact cuts through the oxide interlayer dielectric and the gate oxide layer.

Mikkelson et al., "An NMOS VLSI Process for Fabrication of a 32-Bit CPU Chip", *IEEE Journal of Solid State Circuits*, Vol. SC 16, No. 5, Oct. 1981, pp 542–547, defines diffusion cuts for the n+ source/drain and poly-to-n+ contacts at the gate oxide level so that the source/drain and contacts are formed during the doping of the subsequently-formed poly layer. The poly is patterned with a nitride hook. Thereafter, the LDD regions are implanted through the gate oxide not covered by poly. Then, the poly gate and contact sidewalls and the implanted source/drain regions are thermally oxidized using the nitride as an oxidation mask. A layer of phosphosilicate glass (PSG) is chemically vapor deposited and the self-aligned contact holes are defined through the PSG, taking advantage of the faster etch rate in the PSG as compared to the thermal oxide. A first layer of metallization is then formed, followed by the deposition of an oxide insulator layer and a second layer of metallization.

In contrast to the more conventional approach of forming metal-to-poly contacts by forming contact cuts in an intermediate dielectric layer, Muramoto et al., "A New Self-Aligning Contact Process for MOS LSI", *IEDM Technical Digest*, 1978, pp 185–188, selectively converts the poly gate/contact layer into an isolation oxide. Initially, the gate oxide is patterned to span the gate and LDD regions and a nitride mask is formed over the arsenic-doped poly layer at the gate, substrate contact and interconnection areas. The poly is etched halfway through in the unmasked regions, and a graded n+ n− LDD source/drain is implanted through the reduced thickness poly and LDD-covering oxide. The nitride is removed except at the metal-to-poly contact areas and the poly is oxidized. In the previously unmasked, thin poly regions, the poly is completely converted to oxide by this process, whereas in the exposed poly pattern areas, partial oxidation/conversion provides an insulative oxide layer formed over the poly patterns which include the source/drain-to-metal interconnects. Removal of the remaining nitride exposes the poly contact areas for subsequent metallization.

U.S. Pat. No. 4,441,247, issued Apr. 10, 1984, in the name of Gargini et al., describes an NMOS circuit method for forming self-aligned tungsten contacts and a low temperature plasma nitride interlayer dielectric which does not require the usual high temperature reflow step. In one process sequence, after defining the field oxide, gate oxide and channel implants, contact cuts are opened in the field oxide to the substrate and a layer of phosphorus-doped polysilicon is blanket deposited and used as a solid dopant source for forming buried contacts. A nitride definition mask for the gate is then formed and used additionally as a gate implant mask during the formation of the source and drain and as a gate oxidation mask during reoxidation of a thick insulating layer surrounding the gates. The nitride is then removed, aluminum and tungsten metallization is formed, and the plasma nitride interlayer dielectric layer is deposited, followed by the formation of contact vias through the nitride layer, and metallization.

In an alternative aspect, instead of opening contact cuts directly in the gate oxide early in the process, which can damage the gate oxide due to direct masking thereof, contact cuts can be made after the gate definition and reoxidation step by applying the contact mask to the reoxidation layer and thereby avoiding direct masking of the gate oxide.

In an alternative overall process sequence, the LOCOS nitride field oxide mask is used to form the second, reoxidation layer into a sidewall oxide. Initially, the LOCOS nitride mask is retained and cuts are formed therein defining transistor sites, leaving the nitride intact over the contact sites. After formation of n-type enhancement and depletion transistors using a second nitride layer as a poly definition and source/drain implant mask, the second nitride is retained as a gate oxidation mask during reoxidation of the substrate to form the thick gate-surrounding oxide. In this case, the presence of the original LOCOS nitride mask over the contact regions defines sidewall oxide spacers which align the n+ contact implants and prevents shorting of the subsequently formed gate and contact metallization. In addition to the alignment benefits resulting from using the LOCOS nitride mask in subsequent processing, the process retains the low temperature plasma nitride interlayer dielectric.

As indicated by perusal of the above articles and patents, the effectiveness of lightly doped source-drain structures and sidewall oxide structures in improving device performance and eliminating problems associated with small geometry high density monolithic integrated circuit structures is known. However, in implementing these beneficial structures, particularly in CMOS processes individually or in combination with one another or in combination with self-aligned buried contacts, it is difficult to avoid process complexity and to maintain device yields. It is, accordingly, an object of the present invention to implement a CMOS process which incorporates lightly doped drain-source structures, sidewall oxide structures and self-aligned contacts, yet is of relative simplicity, is conducive to high yields, and is amenable to the incorporation of other beneficial structures.

In addition, it is an object of the present invention to provide a reproducible manufacturing process for forming a short channel graded source and drain doping profile for controlling hot carrier effects.

SUMMARY OF THE INVENTION

In one aspect, the CMOS process which meets the above objectives includes the steps of forming a gate oxide layer over the NMOS and PMOS active regions of the substrate and forming combined contact cuts and source/drain implant cuts through the oxide to the substrate. Next, a layer of intrinsic silicon is deposited on the structure and NMOS active area is given an n-type implant to dope the associated NMOS regions of the silicon layer and the poly-to-source/drain contacts and to simultaneously deposit the NMOS n+ source/drain regions. The structure is then heated in an oxidizing atmosphere to form an oxide implant masking layer over the NMOS active area and to simultaneously drive-in the n+ source/drain implant. Then, the PMOS active area is subjected to a p-type implant to dope the associated PMOS regions of the silicon layer, dope the poly-to-source-/drain contacts and simultaneously deposit PMOS p+ source/drain regions. Next, the NMOS masking layer is removed, and the silicon layer is patterned into a conductor, contact and gate electrode array, then, using the poly definition mask as an oxidation mask, the structure is heated in an oxidizing ambient to form gate oxide sidewall spacers and simultaneously drive-in the source/drain regions and define the silicon-to-source/drain contacts. Thereafter, PMOS LDD structures and NMOS LDD structures are selectively implanted self-aligned with the p+ source/drain and gate and the n+ source/drain and gate respectively; and a metal shunt layer is selectively deposited on the patterned poly following removal of the poly definition mask.

BRIEF DESCRIPTION OF THE DRAWINGS

The above and other objectives and aspects of the present invention are described in detail with respect to the drawings, in which:

FIGS. 1A, 1B, 2A, 2B, 3A, 3B, 4A, 4B, 5, 6A, 6B, 7A, 7B, 8A, 8B, 9A, 9B, 10A and 10B, are schematic cross-sectional representations of a CMOSFET taken sequentially during the major processing steps illustrating the sequence for forming sidewall spacers, LDD structures, and self-aligned contacts in the complementary integrated circuit.

DETAILED DESCRIPTION OF THE INVENTION

Figure 1A:
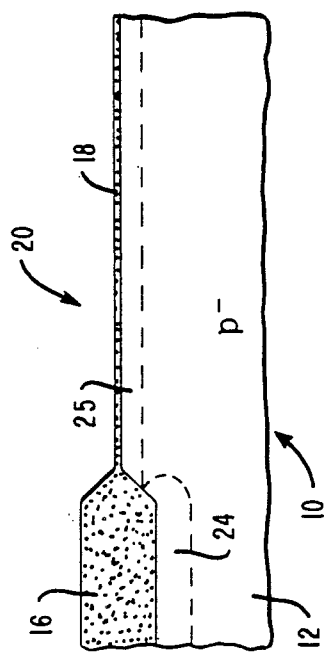
Figure 1B:
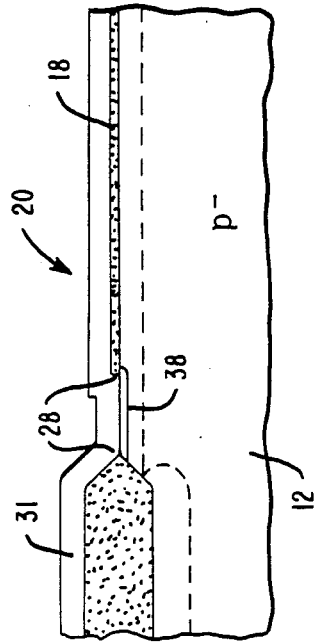

Referring to FIG. 1, there is shown that starting structure which is used in the practice of the present invention. For simplicity, FIGS. 1–4 and 6–10 are divided into A and B constituents to show the n-channel or NMOS active regions 20 on the right and the p-channel or PMOS active regions 22 on the left, as first depicted in FIGS. 1A and 1B. The starting structure typically comprises p-wells or regions 12 and n-wells or regions 14 formed in a (100) single crystal silicon substrate 10. The p-region 12 can be formed in an n-type substrate or vice versa. In one example, the p-well is formed in a n-type substrate to have a resistivity of about 1 to 20 ohm-centimeters by implanting boron at an energy of 70 keV and a dose of $3E12 cm^{-2}$, and to thereby to provide a p-well junction depth of about five micrometers after subsequent high temperature processing.

An alternative, double well fabrication process which features complementary automatically self-aligned well-doping masks is disclosed in commonly assigned, U.S. Pat. No. 4,584,027, entitled "Double Well Single Mask CMOS Process", filed Nov. 7, 1984, in the name of Metz et al.

After the formation of the p-well 12/n-well 14 structures, an isolation structure such as the field oxide 16 is formed, followed by formation of the gate oxide 18 and field and channel implants 24 and 25. Typically, the field oxide 16 is about 850 nanometers thick and can be formed by thermal oxidation of the silicon substrate at about 1150° C. in steam. The gate oxide 18 may be formed to a thickness of about 15–75 nanometers by thermal oxidation of the silicon substrate at 900–1,000° C. in a dry oxygen ambient containing about three percent HCl. Oxynitride gate insulators are also possible candidates. Those of skill in the art will understand that these process parameters, materials and thicknesses are given by way of example only and can be readily changed to achieve the desired structure. These comments apply to the fabrication sequence described below as well.

Figure 2A:
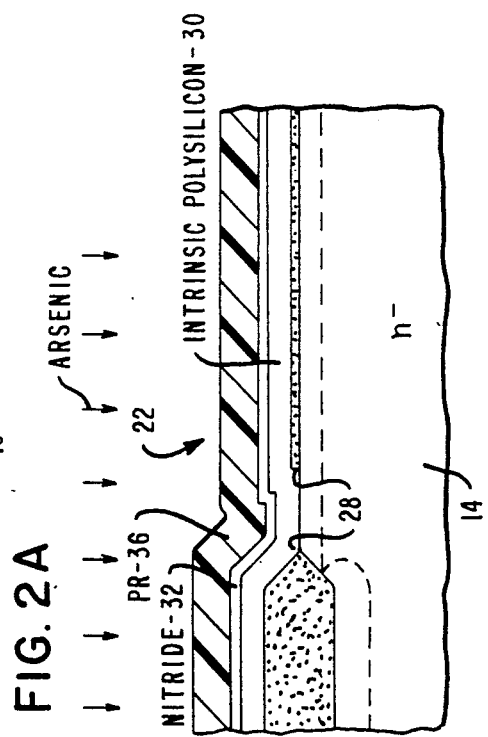
Figure 2B:
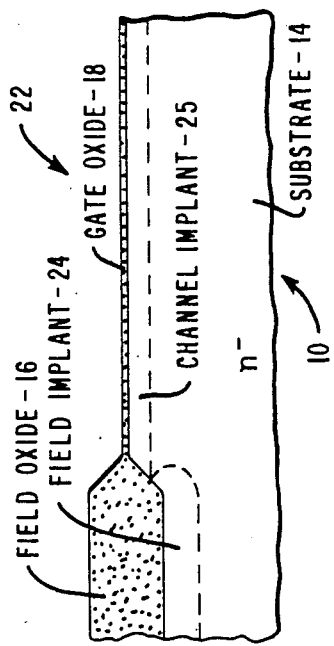

Next, and referring to FIGS. 2A and 2B, contact openings 28-28 are formed in the gate oxide 18. This is done by forming an etch mask over the gate oxide to delineate the contact cuts and then subjecting the structure to an oxide etch process, such as a plasma dry etch providing about 5:1 selectivity to remove the exposed oxide. The etch mask used in this and in several other steps during the processing can be a photoresist layer (not shown) which is deposited and delineated using conventional ultraviolet photolithographic techniques. Such a conventional masks can be used in combination with wet chemical etch techniques such as BHF as well as with previously mentioned dry etch techniques, such as anisotropic reaction ion etching. The typical size of a buried contact formed using the above process would be about 1 micrometer wide for a 1 micrometer poly gate technology.

Next, referring further to FIGS. 2A and 2B, a layer of intrinsic polycrystalline (or amorphous) silicon 30 is formed over the structure to a typical thickness of about 200 nanometers, followed by deposition of a layer 32 of silicon nitride about 50 nanometers thick using a CVD plasma nitride process and an $NH_3/SiH_4$ deposited gas system. A photoresist etch and implant mask 36 is then formed over the p-channel active areas 22 and the nitride 32 is removed from the n channel areas 20, for example, using the reactive ion etching technique and a $SF_6/O_2$ etching gas system. The structure is then subjected to an $n^+$ implant of arsenic or phosphorus (arsenic; 150 keV; $8E15 cm^{-2}$) in the presence of the p-channel mask 36 to selectively dope the poly layer 31 in the exposed n-channel regions 20, including unmasked region 31 in p-channel region 22, to a selected n-type conductor concentration and to simultaneously implant the poly-to-$n^+$ source/drain contacts 38 and deposit the $n^+$ source/drain regions (also 38).

Figure 3A:
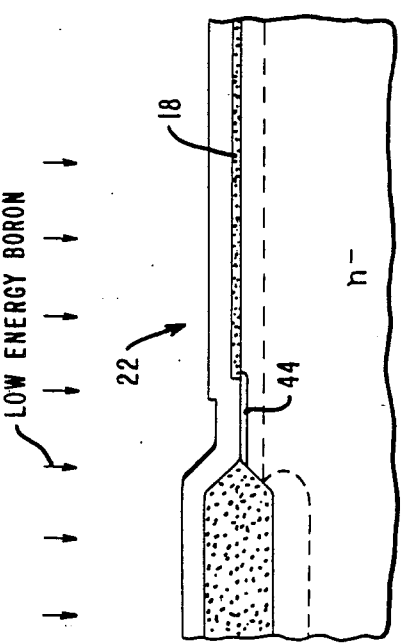
Figure 3B:
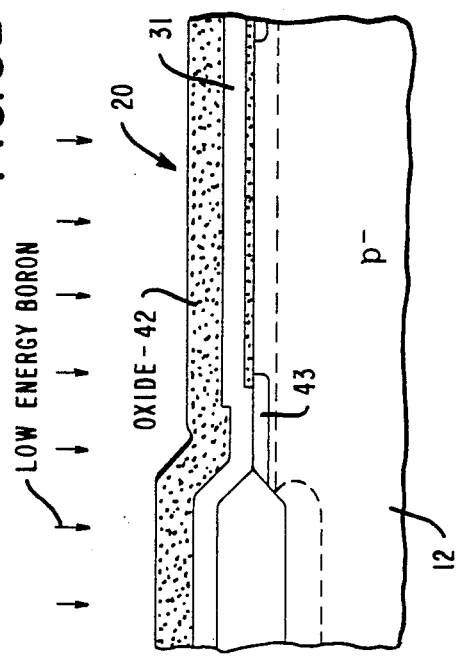

Progressing toward the structure in FIGS. 3A and 3B, the next step is to remove the p-channel etch and implant mask 36 by any one of several techniques, such as an oxygen plasma, a "piranha" wet chemical resist strip using concentrated sulfuric acid and ammonia persulfate, or an ultrasonic acetone bath. Then, the n-channel regions 20 of the silicon, which are not covered by the p-channel nitride mask 32, are selectively oxidized. The resulting oxide implant mask 42 is, thus, automatically formed over the n-channel region 20 in self-alignment with, and as the complement of, the p-channel masking nitride 32 (FIG. 2A). One suitable process is steam oxidation applied at about 900° C. for 10 minutes. The resulting oxide thickness is approximately 150 nanometers on the n-type bay. Nitride mask 32 is removed in conventional manner to complete the formation of complement oxide implant mask 42 as shown in the combination of FIGS. 3A and 3B.

In addition to forming the oxide mask 42, the thermal oxidation also serves to simultaneously predrive-in the $n^+$ source/drain implant to form $n^+$ source/drain diffusion 43. That is, thermal oxidation diffuses the arsenic from the n-doped poly 31 into the n-channel source and drain regions.

Referring still further to FIGS. 3A and 3B, the p-channel regions in 22 are then given a $p^+$ implant ($BF_2$; 60 keV; $5E15 cm^{-2}$), corresponding to the previous $n^+$ implant of the n-channel regions 20. In this case, the silicon oxide 42 masks the n-channel regions 20. The $p^+$ implant dopes the p-channel source/drain regions 44 and simultaneously dopes the associated p-channel regions 22 to form a doped poly layer 39 (FIG. 4A) to a selected, p-type conductor concentration for interconnect conductors, gate electrodes, and poly-to-$p^+$ source/drain contacts. The combination of optimizing the implant energy and dose, the gate insulator properties, and subsequent annealing, reduces the possibility of boron penetrating the p-channel gate oxide 18. The anneal extends the $p^+$ implant region 44 to a region 45 in FIG. 4A. Next, the oxide n-channel implant mask 42 is removed, as shown in FIG. 4B, using a hydrofluoric acid bath.

Figure 4A:
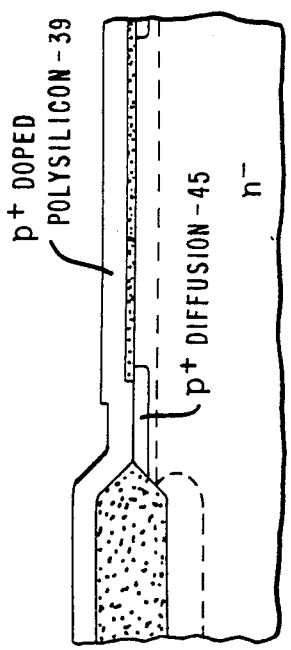
Figure 4B:
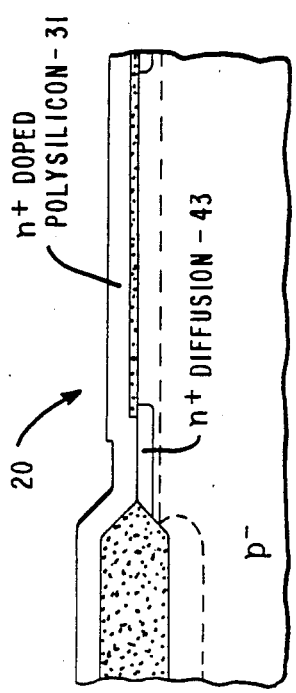
Figure 5:
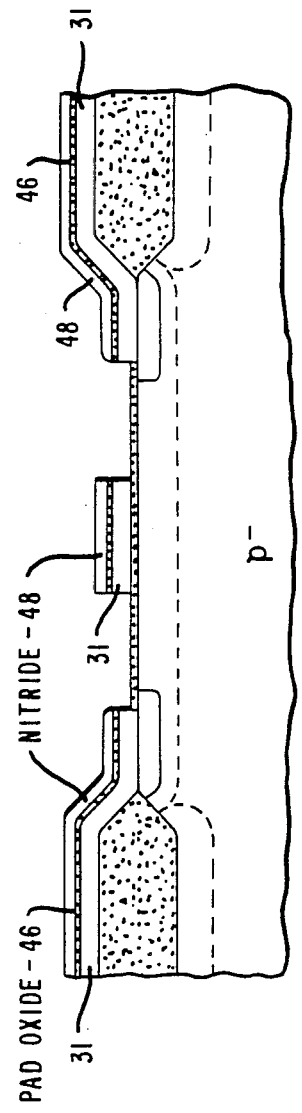

Referring to FIG. 5, an extension of the n-channel region 20 in FIG. 4B, the poly 31 is etched to form a selected pattern of conductors using a silicon nitride patterning mask 48. The mask 48 serves the dual purpose of a poly-definition mask and, subsequently, a poly-oxidation mask during the formation of sidewall oxide spacers. A typical process for forming the nitride mask 48 and patterning the poly 30 involves, first, forming a pad oxide layer 46 to a thickness of about 10 nanometers using thermal oxidation. (The primary purpose of the pad oxide 46 is to serve as a nitride etch stop during subsequent removal of the nitride.) Next, the overlying masking nitride layer 48 is formed to a thickness of about 40 nanometers using conventional low pressure chemical vapor deposition (LPCVD). Then, a photoresist etch mask (not shown) is formed on the nitride to delineate the desired poly pattern. In a presently preferred technique, a conventional polysilicon dry etch is used to successively etch the nitride 48, oxide 46 and poly 31. Alternatively, selective etch techniques can be applied as sequential steps to pattern the nitride, oxide and poly. This pattern must be accurately aligned, such that maximum misalignment and etch biases can total 0.1 micrometers for a 0.5 micrometer polysilicon technology as shown in FIG. 5 for an n-channel device.

Figure 6A:
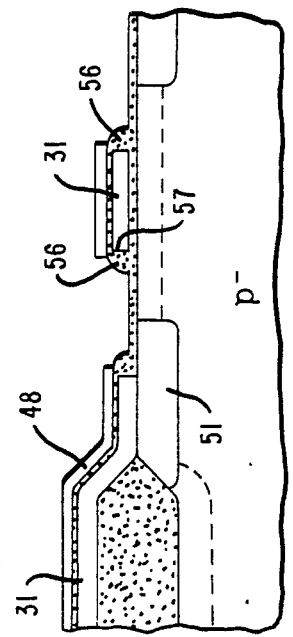
Figure 6B:
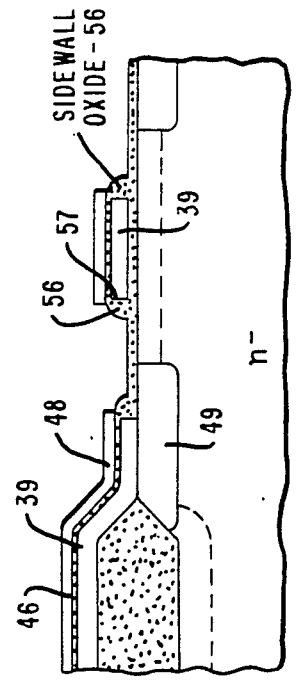

Referring to FIGS. 6A and 6B, following the etch of the nitride pattern and the removal of the photoresist mask, a combined sidewall oxidation and diffusion drive-in step is implemented. Here, the nitride mask 48 is retained on the poly and used as an oxidation mask while the structure is heated at a relatively low temperature (typically 800–900° C.) in an oxidizing ambient to selectively form oxide sidewall spacer layers 56–56 approximately 80–100 nanometers thick on the sidewalls 57 of both the n-channel and the p-channel gate electrode segments of doped poly layers 31 and 39. This thickness is sufficient to provide electrical separation between the gate electrodes and the subsequently formed source/drain contact metallization. In addition, the thermal step is used, in conjunction with the subsequent anneal, to establish the desired n+ and p+ junction depths. That is, this step simultaneously drives-in the n+ and p+ source/drain diffusion regions 43 and 45 (FIGS. 4A and 4B) and forms the poly-to-n+ and-p+ source/drain buried contacts 49 and 51.

Referring to FIGS. 7A and 7B, a low dose, low energy p-type LDD implant structure 58 is formed in the p-channel region 22. To implement this p-type LDD FET implant, a photoresist mask 60 is formed on the n-channel active regions 20 and p-type impurities are implanted (boron; 30keV; 8E14 cm$^{-2}$).

Referring now to FIGS. 8A and 8B, after removing the n-channel mask 60, a photoresist mask 62 is formed over the p-channel regions 22. Then, the LDD formation for the n-channel devices 20 are implemented. A low dose, low energy n− LDD implant 63 is self-aligned with the n+ source/drain regions 51 and the gate electrodes 31 (phosphorus; 60 keV; 5E14 cm$^{-2}$).

Figure 9A:
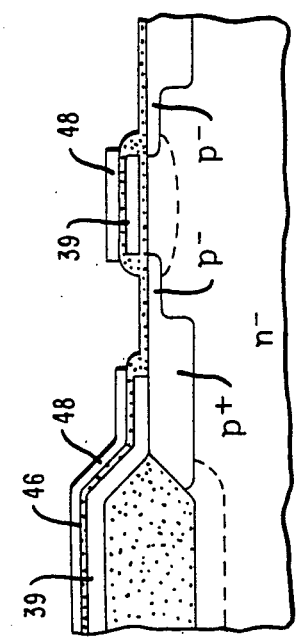
Figure 9B:
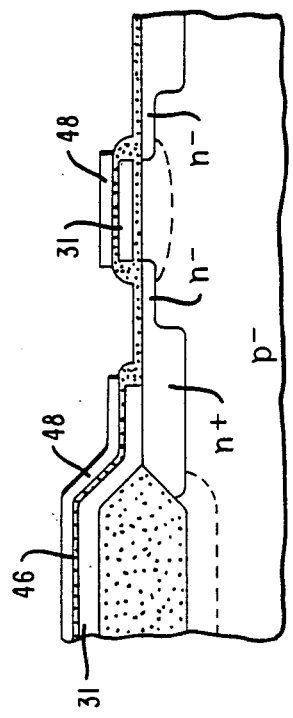

Referring to FIGS. 9A and 9B, the p-channel active area mask 62 is removed. Then, the structure is annealed (typically 900° C. temperature; 30 minutes time; N$_2$ atmosphere) to anneal implant damage, activate the implanted species and drive-in all implants. For the above-described exemplary conditions and parameters, the resulting n+ source/drain junction depths are about 0.25 microns, whereas the p+ source/drain junctions are about 0.30 microns.

Figure 10A:
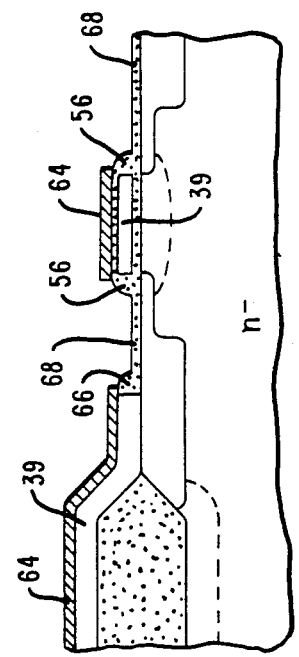
Figure 10B:
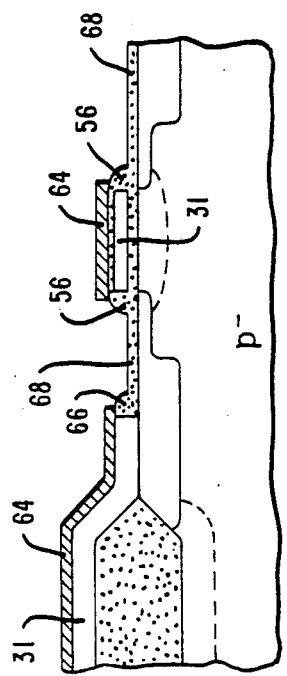

Referring to FIGS. 10A and 10B, next the silicon nitride layers 48 (FIGS. 9A and 9B) are removed using a plasma strip process. During this nitride etch, the pad oxide 46 acts as an etch stop to prevent etching of the poly 31 and 39 underlying the silicon nitride 48. Following the nitride etch the thin pad oxide 46 is removed by a brief oxide selective etch. Then, a metal such as tungsten is deposited on the polysilicon, preferably using selective deposition techniques such as chemical vapor deposition. In the case of tungsten, the metal is selectively deposited to a thickness of about 150 nanometers on the doped poly regions 31 and 39, preferably by chemical vapor deposition using WF$_6$ and H$_2$. This process selectively forms tungsten shunts 64 over poly conductors 31 and 39 to provide low resistance conduction paths. At the same time, the gate electrode sidewall oxides 56, contact sidewall oxides 66, and source/drain region masking oxides 68 prevent any undesired deposition in the source and drain regions.

This completes the critical steps of the present invention. Standard processing sequences can then be employed to complete the complementary monolithic integrated circuit, including forming an interlayer dielectric layer, selectively defining contact cuts in the interlayer dielectric to the underlying conductors, and forming metallization contacting the conductors via the contact cuts, followed by passivation.

As described, the present process provides reduced device size due to the use of buried contacts and lightly doped drain (LDD) transistors with self-aligned contacts. N-type gates are used for n-channel devices, and p-type gates for p-channel devices, without a diode drop across the interconnects as the result of the tungsten shunt layer. Both Miller capacitance and short channel effects are reduced.

Having thus described a preferred and alternative embodiments of the present self-aligned LDD CMOS fabrication process, what is claimed is:

1. In a process for forming a complementary metal oxide semiconductor integrated circuit, the sequence for forming self-aligned contacts and lightly doped drain structures, which comprises:
   (A) forming a gate oxide layer over n-channel and p-channel active regions of a substrate having combined contact cuts and source and drain implant cuts therethrough to the substrate;
   (B) forming a layer of intrinsic silicon on the resulting structure;
   (C) in the presence of a masking layer, selectively subjecting the n-channel active area to a relatively high dose n-type implant to dope the associated n-channel regions of the silicon layer, silicon-to-substrate contacts and n+ source and drain regions;
   (D) heating the structure in the presence of a masking layer and in an oxidizing atmosphere to selectively form an oxide implant masking layer over the n-channel active areas and simultaneously drive-in the n+ source and drain implants;
   (E) in the presence of the oxide implant masking layer, selectively subjecting the PMOS active area to a p+- type implant to dope the associated p-channel regions of the silicon layer, silicon-to-substrate contacts, and p+ source and drain regions;
   (F) removing the n-channel oxide masking layer;
   (G) forming a conductor defining mask over the resulting structure and patterning the silicon layer into an array selected from the group consisting of interconnects, contacts and gate electrodes;
   (H) heating the structure in an oxidizing ambient to selectively form gate electrode side wall spacers and simultaneously drive-in the source and drain regions and define the silicon-to-source and drain contacts;
   (I) selectively and alternately forming relatively lightly doped p and n LDD structures in the n-channel and p-channel regions self-aligned with the respective p+ and n+ source, drain and gate regions, respectively; and
   (J) selectively depositing a metal shunt layer on the patterned silcon array.

2. The complementary metal oxide semiconductor process of claim 1, wherein the oxide implant masking layer is formed selectively as defined in said oxidizing heating step (D) as the result of a patterned layer of nitride being formed over the silicon before step (D) by: forming a nitride layer over the silicon; forming a mask over the nitride having openings exposing the n-channel regions; and etching the nitride in the presence of the mask to remove the nitride from the n-channel regions and thereby define the nitride into an oxidation mask.

3. The complementary metal oxide semiconductor process of claim 1, further comprising: in implementing the silicon patterning step (G), the sequence of: forming a nitride etch stop layer of oxide on the silicon; forming a nitride layer on the etch stop layer; forming a masking layer over the nitride to delineate the desired silicon pattern; and sequentially etching the nitride, oxide and silicon to form the desired silicon pattern; wherein during the oxidizing heating step (H), the nitride layer is used as an oxidation mask to prevent oxidation of the upper silicon surface and thereby selectively oxidize the sidewalls of the silicon to define gate electrode sidewall oxide spacers;

wherein the nitride masking layer is removed by etching after the LDD formation step (I) prior to the metal shunt formation step (J); and wherein during said nitride etch, said nitride etch stop layer of oxide protects the underlying silicon conductor pattern.

4. In a process for forming a complementary metal oxide semiconductor integrated circuit, the sequence for forming self-aligned contacts and lightly doped drain structures which comprises:

(A) forming a gate oxide layer over the n-channel and p-channel active regions of a substrate having combined contact cuts and source and drain implant cuts therethrough to the substrate;

(B) forming a layer of intrinsic silicon on the resulting structure;

(C) forming a layer of nitride over the silicon;

(D) forming a photoresist mask over the nitride covering the p-channel regions and selectively exposing the n-channel regions;

(E) etching the nitride in the presence of the photoresist mask to expose the n-channel regions and thereby define the nitride into an oxidation mask;

(F) in the presence of the photoresist mask, subjecting the structure to an n-type implant to selectively dope the n-channel regions of the silicon layer, silicon-to-substrate contacts and n+ source and drain regions;

(G) removing the photoresist mask and, in the presence of the nitride oxidation mask, heating the structure in an oxidizing atmosphere to selectively form an oxide implant masking layer over the exposed n-channel active regions and simultaneously partially drive-in the n+ source and drain implanted regions;

(H) in the presence of the oxide implant masking layer, selectively subjecting the p-channel active areas to a p-type implant to dope the p-channel regions of the silicon layer, poly-to-substrate contacts, and p+ source and drain regions;

(I) removing the oxide implant masking layer;

(J) patterning the silicon layer into an array selected from the group consisting of conductors, contacts and gate electrodes;

(K) heating the structure in an oxidizing ambient to selectively form gate electrode sidewall oxide spacers and simultaneously drive-in the source and drain regions and define the silicon-to-source and drain contacts;

(L) selectively and alternately forming relatively lightly doped p-type and n-type LDD structures in the n-channel and p-channel regions self-aligned with the respective p+ and n+ source, drain and gate regions, respectively; and (M) selectively depositing metal shunt layer on the patterned silicon array.

5. In a process for forming a complementary metal oxide semiconductor integrated circuit, the sequence for forming self-aligned contacts and lightly doped drain structures, comprising:

(A) forming a gate oxide layer over the n-channel and p-channel active regions of a substrate having combined contact cuts and source and drain implant cuts therethrough to the substrate;

(B) forming a layer of intrinsic silicon on the resulting structure;

(C) forming a layer of nitride over the silicon;

(D) forming a photoresist mask over the nitride covering the p-channel regions and selectively exposing the n-channel regions;

(E) etching the nitride in the presence of the photoresist mask to expose the n-channel regions and thereby define the nitride into an oxidation mask;

(F) in the presence of the photoresist mask, subjecting the structure to an n-type implant to selectively dope the n-channel regions of the silicon layer, silicon-to-substrate contacts and n+ source and drain regions;

(G) removing the photoresist mask and, in the presence of the nitride oxidation mask, heating the structure in an oxidizing atmosphere to selectively form an oxide implant masking layer over the exposed n-channel active regions and simultaneously partially drive-in the n+ source and drain implanted regions;

(H) in the presence of the oxide implant masking layer, selectively subjecting the p-channel active areas to a p-type implant to dope the associated p-channel regions of the silicon layer, silicon-to-substrate contacts, and p+ source and drain regions;

(I) removing the oxide implant masking layer;

(J) patterning the silicon layer into a selected conductor, contact and gate electrode array by:
forming an oxide etch stop layer on the silicon;
forming a nitride layer on the oxide etch stop layer;
forming a masking layer over the nitride delineating the desired silicon pattern; and
sequentially etching the nitride, oxide, and silicon to form the desired silicon pattern;

(K) using the nitride mask layer as an oxidation mask to prevent oxidation of the upper silicon surface, heating the structure in an oxidizing ambient to selectively form gate oxide sidewall spacers and simultaneously drive-in the source and drain regions and define the silicon-to-substrate contacts;

(L) selectively and alternately forming relatively lightly doped p-type and n-type LDD structures in the n-channel and p-channel regions self-aligned with the respective p+ and n+ source, drain and gate regions, respectively;

(M) removing the nitride masking layer; and (N) selectively depositing a metal shunt layer on the patterned silicon array.

* * * * *